United States Patent
Gilchrist et al.

(10) Patent No.: US 7,677,859 B2
(45) Date of Patent: *Mar. 16, 2010

(54) SUBSTRATE LOADING AND UPLOADING STATION WITH BUFFER

(75) Inventors: Ulysses Gilchrist, Reading, MA (US);
David R. Beaulieu, Groton, MA (US);
Peter Van Der Meulen, Newburyport, MA (US)

(73) Assignee: Brooks Automation, Inc., Chelmsford, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/623,970

(22) Filed: Jul. 21, 2003

(65) Prior Publication Data

US 2004/0141831 A1 Jul. 22, 2004

Related U.S. Application Data

(63) Continuation-in-part of application No. 10/200,818, filed on Jul. 22, 2002, now Pat. No. 6,869,263.

(51) Int. Cl.
*H01L 21/677* (2006.01)
(52) U.S. Cl. .................. 414/217; 414/217.1; 414/218; 414/221; 414/411; 414/935; 414/940
(58) Field of Classification Search .......... 414/217, 414/217.1, 218, 221, 935, 939, 940, 411
See application file for complete search history.

(56) References Cited

U.S. PATENT DOCUMENTS

| | | | |
|---|---|---|---|
| 4,674,939 A | 6/1987 | Maney et al. | 414/292 |
| 4,676,709 A | 6/1987 | Bonora et al. | 414/217 |
| 4,758,127 A | 7/1988 | Imai et al. | 414/411 |
| 4,836,733 A | 6/1989 | Hertel et al. | |
| 4,895,486 A | 1/1990 | Baker et al. | 414/331 |
| 4,917,556 A | 4/1990 | Stark et al. | 414/217 |
| 4,995,430 A | 2/1991 | Bonora et al. | 141/98 |
| 5,139,459 A | 8/1992 | Takahashi et al. | 454/187 |
| 5,291,923 A | 3/1994 | Gallagher et al. | 141/98 |

(Continued)

FOREIGN PATENT DOCUMENTS

EP 452939 10/1991

(Continued)

OTHER PUBLICATIONS

Definition of "encoder", Merriam-Webster Online.*

(Continued)

*Primary Examiner*—Michael S Lowe
(74) *Attorney, Agent, or Firm*—Perman & Green, LLP; Richard Pickreign, Esq.

(57) ABSTRACT

A substrate processing apparatus having a station for loading and unloading substrates from the apparatus, includes an aperture closure for sealing a loading and unloading aperture of the station, apparatus for removing a door of a substrate magazine and thus opening the substrate magazine, and for operating the aperture closure to open the aperture, and an elevator for precisely positioning the open substrate magazine along a vertical axis within a usable range of motion. The station may also include a sensor for mapping locations of the substrates, and a mini-environment for interfacing the station to a substrate processing system.

12 Claims, 9 Drawing Sheets

U.S. PATENT DOCUMENTS

| | | | |
|---|---|---|---|
| 5,380,682 A | 1/1995 | Edwards et al. | |
| 5,387,265 A | 2/1995 | Kakizaki et al. | 29/25.01 |
| 5,407,350 A | 4/1995 | Iwabuchi et al. | |
| 5,418,382 A | 5/1995 | Blackwood et al. | 250/561 |
| 5,431,600 A | 7/1995 | Murata et al. | 454/187 |
| 5,509,772 A | 4/1996 | Doche | 414/217 |
| 5,540,098 A | 7/1996 | Ohsawa | 73/629 |
| 5,551,830 A | 9/1996 | Watanabe et al. | 414/786 |
| 5,570,990 A | 11/1996 | Bonora et al. | 414/543 |
| 5,605,428 A | 2/1997 | Birkner et al. | 414/331 |
| 5,772,386 A | 6/1998 | Mages et al. | 414/411 |
| 5,788,447 A | 8/1998 | Yonemitsu et al. | 414/217 |
| 5,857,848 A | 1/1999 | Takahashi et al. | 432/253 |
| 5,882,165 A | 3/1999 | Maydan et al. | |
| 5,906,469 A * | 5/1999 | Oka et al. | 414/416.08 |
| 5,980,183 A | 11/1999 | Fosnight | 414/222.01 |
| 6,012,894 A | 1/2000 | Watanabe et al. | 414/806 |
| 6,013,920 A | 1/2000 | Gordon et al. | |
| 6,071,059 A | 6/2000 | Mages et al. | 414/411 |
| 6,135,698 A * | 10/2000 | Bonora et al. | 414/416.01 |
| 6,183,186 B1 | 2/2001 | Howells et al. | |
| 6,188,323 B1 * | 2/2001 | Rosenquist et al. | 340/686.5 |
| 6,281,516 B1 | 8/2001 | Bacchi et al. | |
| 6,318,945 B1 | 11/2001 | Hofmeister | |
| 6,410,455 B1 | 6/2002 | Kuribayashi et al. | |
| 6,452,201 B1 * | 9/2002 | Wang et al. | 250/559.29 |
| 6,501,070 B1 | 12/2002 | Bacchi et al. | 250/239 |

FOREIGN PATENT DOCUMENTS

| | | |
|---|---|---|
| EP | 574893 | 12/1993 |
| FR | 2696429 | 4/1994 |
| JP | 62258881 | 11/1987 |
| JP | 1291442 | 11/1989 |
| JP | 1310686 | 12/1989 |
| JP | 269955 | 3/1990 |
| JP | 3261161 | 11/1991 |
| JP | 479347 | 3/1992 |
| JP | 485813 | 3/1992 |
| JP | 4360545 | 4/1992 |
| JP | 4206547 | 7/1992 |
| JP | 4505234 | 9/1992 |
| JP | 4302454 | 10/1992 |
| JP | 5338728 | 5/1993 |
| JP | 632449 | 2/1994 |
| JP | 6151266 | 5/1994 |
| JP | 6211311 | 6/1994 |
| JP | 6302679 | 10/1994 |
| JP | 8-279546 | 10/1996 |
| JP | 2000-188320 | 7/2000 |
| JP | 2001-250853 | 9/2001 |
| JP | 01-284439 | 10/2001 |
| JP | 2002-9131 | 1/2002 |

OTHER PUBLICATIONS

Definition of "buffer", Merriam-Webster Online.*
Encoder definiton from http://www.techweb.com/encyclopedia.*

* cited by examiner

SUBSTRATE LOADING AND UPLOADING STATION WITH BUFFER

This application is a continuation in part of application Ser. No. 10/200,818, filed Jul. 22, 2002 now U.S. Pat. No. 6,869,263.

BACKGROUND OF THE INVENTION

1. Field of the Invention

The invention is directed to a loading and unloading station for substrates with one or more magazines that serve as a substrate buffer. The invention is capable of mapping features of the substrates and indexing the substrates in a Z-axis direction.

2. Brief Description of Related Developments

To minimize process defects, substrate processing equipment manufacturers have attempted to prevent particles from reaching the substrates. Systems have been designed to isolate substrates from particles during storage, transport and transfer into processing equipment. The Standard Mechanical Interface (SMIF) system has been devised and used to reduce particle contamination by significantly reducing particle fluxes onto substrates. This has been accomplished by mechanically ensuring that during transport, storage and processing of the substrates, the gaseous media (such as air or nitrogen) surrounding the substrates is essentially stationary relative to the substrates and by ensuring that particles from the ambient outside environment do not enter the immediate internal substrate environment.

A typical SMIF system utilizes minimum volume, dust proof boxes or carriers for storing and transporting open rack substrate cassettes. The carriers have doors designed to mate with doors on interface ports on the substrate processing equipment. In a typical SMIF system, a carrier is positioned at the interface port and the carrier and port doors are opened simultaneously. A manipulator may then individually remove the substrates and transport them to a load lock for processing in a vacuum system.

The SMIF box is bottom loading design and is generally used to carry substrates sized to a diameter of 200 mm. More recently, carriers have been developed that are of the front opening unified pod (FOUP) design, intended to carry larger substrates.

Present carrier systems typically couple a single carrier to the substrate processing system at a time. It would be advantageous to provide a substrate loading and unloading system capable of interfacing a number of carriers to the substrate processing system, allowing a larger number of substrates to be processed before the carriers must be emptied and refilled.

With either a cassette or FOUP carrier, a front end is typically provided between the carrier and the substrate processing equipment to align each substrate and/or to place each substrate at a specific XYZ location for access by a transport apparatus or robot. It would be advantageous to provide a substrate loading and unloading system capable of determining the locations of substrates and features of those substrates within each carrier. It would also be advantageous to provide a substrate loading and unloading system capable of placing a substrate at a specific XYZ location. These features could allow such a substrate loading and unloading system to be coupled directly to a substrate processing system, eliminating the need for a front end for substrate alignment or placement.

In light of the foregoing state of the art the present invention has been conceived and is now reduced to practice.

SUMMARY OF THE INVENTION

A substrate processing apparatus having a station for loading and unloading substrates from the apparatus, includes an aperture closure for sealing a loading and unloading aperture of the station, apparatus for removing a door of a substrate magazine and thus opening the substrate magazine, and for operating the aperture closure to open the aperture, and an elevator for precisely positioning the open substrate magazine along a vertical axis within a usable range of motion. The elevator operates such that a substrate within the open magazine is positioned substantially in a wafer transport plane, and is thus accessible by a transport apparatus. In one embodiment, the elevator includes a device for positioning the open substrate magazine such that substantially no vertical movement is required by the transport apparatus. The station also includes a buffer transport for positioning one or more substrate magazines along a second axis oriented in a second direction, and a sensor for mapping vertical locations of the substrates. The station may also include a shuttle for transporting the one or more magazines along a third axis oriented in a third direction, and a mini-environment for interfacing the station to the substrate processing apparatus.

BRIEF DESCRIPTION OF THE DRAWINGS

The foregoing aspects and other features of the present invention are explained in the following description, taken in connection with the accompanying drawings, wherein.

DETAILED DESCRIPTION OF THE PREFERRED EMBODIMENTS

Figure 1:
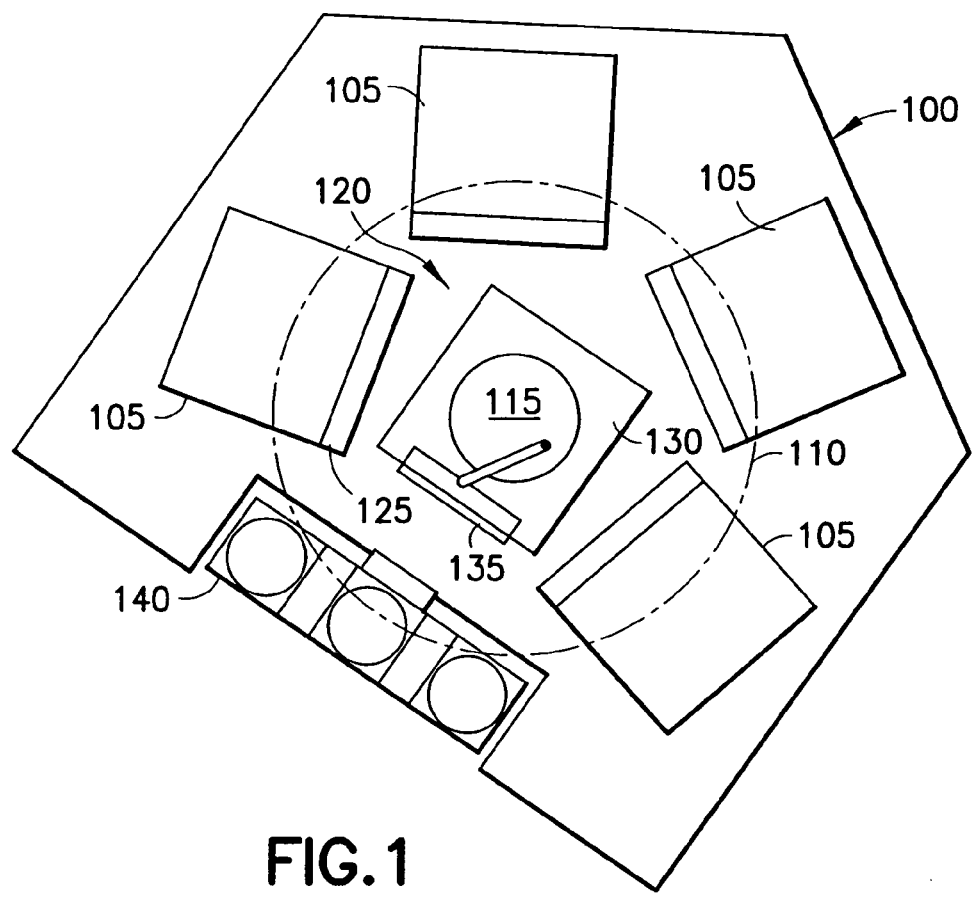
FIG. 1 is a top plan diagrammatic view of a substrate processing system embodying the present invention, with the cover removed from the transport chamber.

Referring to FIG. 1, a perspective view of a system 100, incorporating features of the present invention, is illustrated. Although the present invention will be described with reference to the embodiment shown in the drawings, it should be understood that the present invention can be embodied in many alternate forms of embodiments. In addition, any suitable size, shape or type of elements or materials could be used.

As shown in FIG. 1, the system 100 is generally a substrate processing system for processing substrates. The substrates may include 200/300 mm wafers used in semiconductor manufacturing, panels used in the manufacture of flat panel displays, or any other desired type of substrates. The substrate processing system 100 includes one or more processing modules 105 for performing operations on substrates such as imaging, plasma etching, and the like. It is typical for the processing modules 105 to be arranged about a closed locus as indicated by a dashed line 110.

A transport apparatus 115 is centrally disposed within a transport chamber 120 for transferring substrates among the one or more of the processing modules 105. Transport chamber 120 is preferably maintained substantially at a vacuum to prevent contamination of substrates while they are transported among processing modules 105. It should be understood that transport chamber 120 may contain any other desired atmosphere for processing substrates. The substrate processing system 100 preferably includes appropriate systems and plumbing (not shown) for generating, and maintaining the desired atmosphere in transport chamber 120. For example, a vacuum pump (not shown) may be connected to transport chamber 120 using suitable plumbing to draw a desired vacuum condition in transport chamber 120. The vacuum pump may be regulated by a controller using appropriate monitoring and control devices (not shown) such as pressure gauges and valves.

Isolation valves 125 are individually provided at the interfaces of the one or more processing modules 105 and the transport chamber 120. Isolation valves 125 may comprise slot valves, solenoid valves, hydraulic valves, or any other suitable valves that are capable of being individually opened and closed, and that when closed, form a substantially airtight seal between the transport chamber 120 and the corresponding processing module.

Each processing module 105 may include one or more systems for processing substrates, for example, sputtering, coating, etching, soaking, or any other suitable process for substrates deposited in the respective processing modules. Each processing module 105 may also include additional isolation valves (not shown) that allow communication with other equipment, or substrate processing by other equipment.

Transport apparatus 115 typically includes a drive section 130 and one or more end effectors 135. A preferred embodiment of transport apparatus 115 is described in U.S. Pat. No. 5,180,276, incorporated by reference in its entirety. Drive section 130 may be capable of positioning end effector at any desired XYZ location within transport chamber 120 or may provide limited positioning capabilities, for example, only in the X and Y directions. Drive section 130 is preferably operable to move end effector 135 along a wafer transfer plane as described in greater detail below. In one embodiment of the present invention, the X and Y directions are horizontal directions and the Z direction is a vertical direction.

Figure 2:
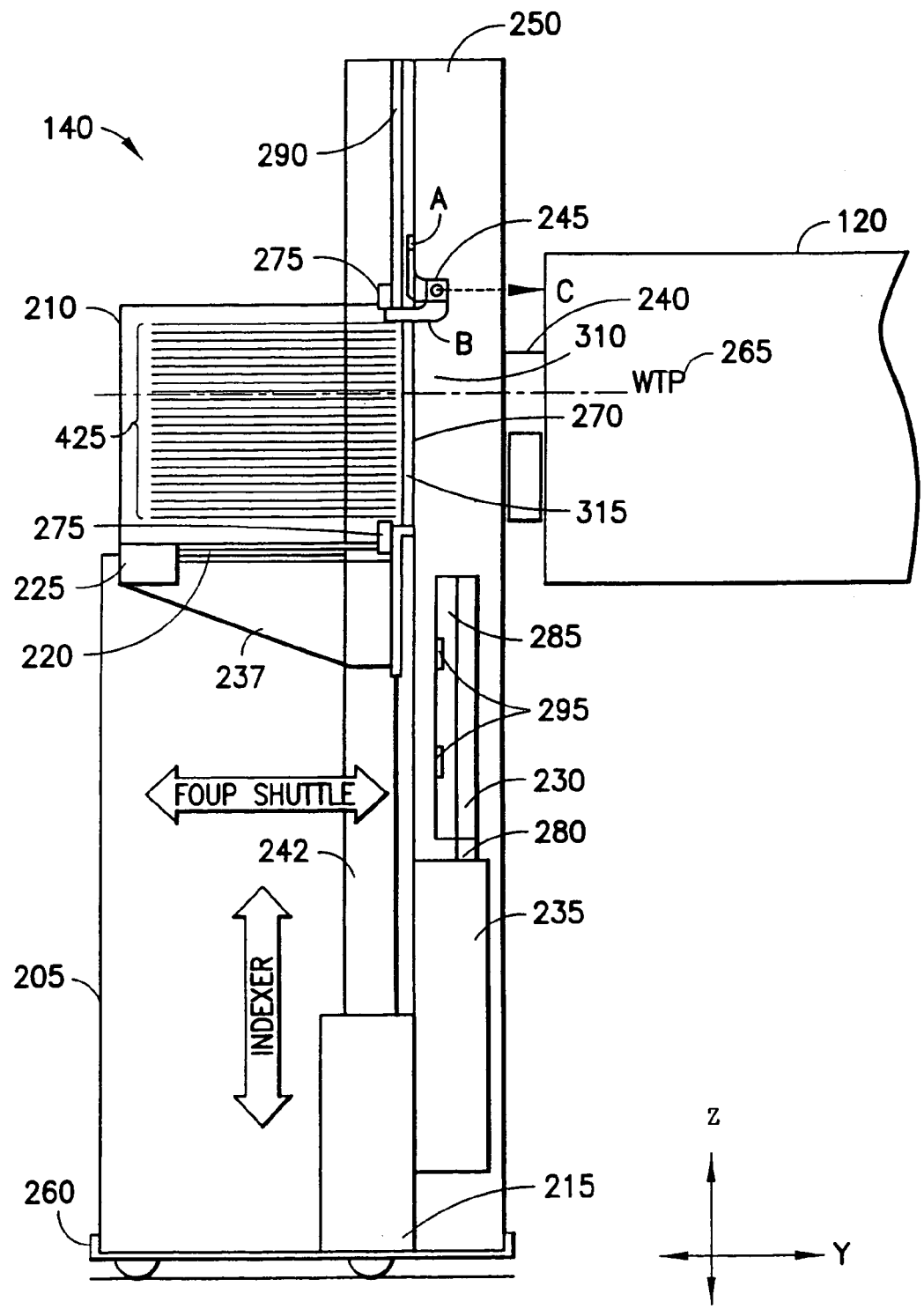
FIG. 2 shows a schematic side view of a substrate station in accordance with the present invention.

Substrate processing system 100 also includes a substrate loading and unloading station, or loadport, referred to herein as a substrate station 140, in accordance with the present invention. Substrate station 140 is preferably sealingly positioned in close contact with transport chamber 120 such that transport apparatus 115 may access substrates conveyed by substrate station 140. FIG. 2 shows a side view and FIG. 6 shows a top view of the substrate station 140. Substrate station 140 has a frame 205 for supporting its components and one or more magazines 210. For purposes of this invention a magazine will be understood to include a cassette, a FOUP, or any other substrate carrying device that positions or holds substrates in a spaced arrangement. In this embodiment, magazine 120 is shown as a FOUP for example purposes only.

Figure 3:
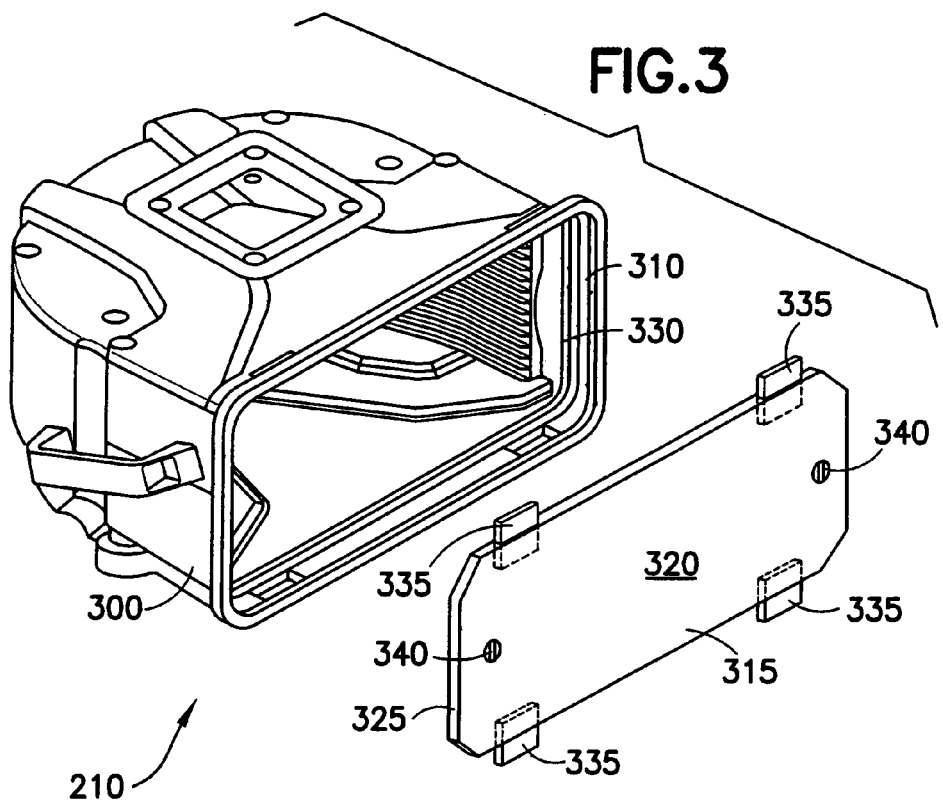
FIG. 3 shows an example embodiment of a magazine.

FIG. 3 shows an example of magazine 120. Magazine 120 includes a housing 300 and a magazine opening 310 for providing access to the interior thereof and for receiving a magazine door 315. Magazine door 315 in this example includes a generally rectangular plate 320 with a peripherally extending continuous flange 325. A seal 330 is interposed between flange 325 and magazine opening 310. When magazine door 315 is positioned in magazine opening 310, flange 325 firmly engages seal 330 to seal the interior of magazine 120 from the surrounding atmosphere. A plurality of latch members 335 are provided on magazine door 315 at peripherally spaced locations for locking the carrier door 315 in place in magazine opening 310. Latch members 335 are movable between an extended, locking position as shown, and a retracted, release position. Latch operating mechanisms 340 are operably connected to latch members 335 for moving the latch members between the locking position and the release position. Latch operating mechanisms 340 may be connected by, or may be comprised of, linkages, solenoid devices, or other appropriate apparatus.

Figure 4:
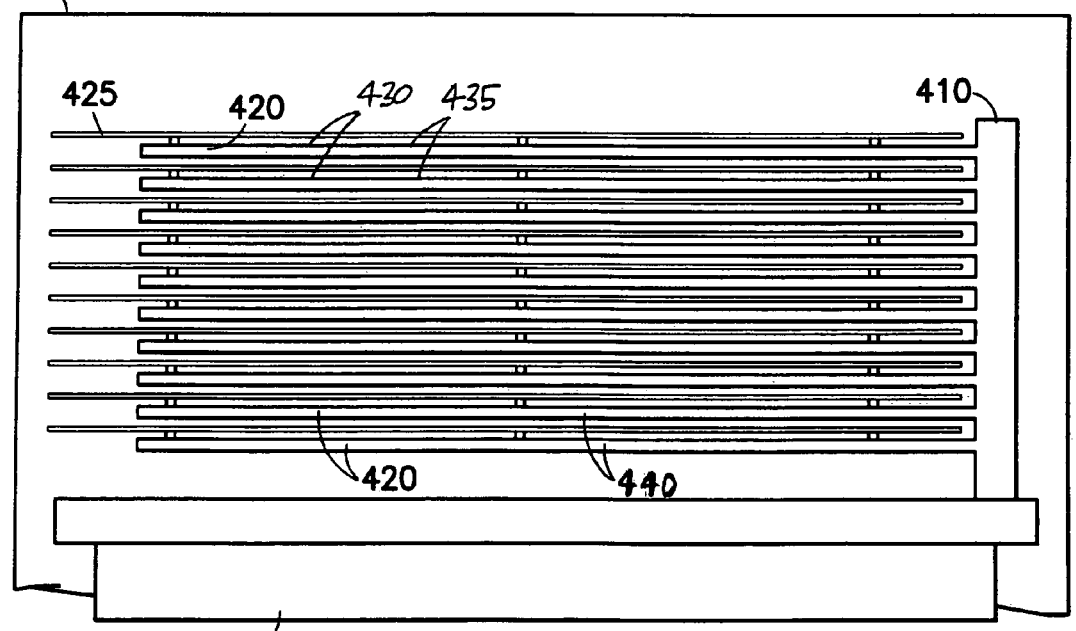
FIG. 4 shows a cross sectional view of a magazine.

FIG. 4 shows a cross sectional view of magazine 210. In this embodiment, magazine 210 includes a mounting manifold 410 which is suitably mounted on, and projects upwardly from a magazine base 415. A plurality of vertically spaced support plates 420 are integral with the mounting manifold 410 and project away from the mounting manifold and lie in equally spaced parallel planes. The spacing between the support plates 420 may be substantially greater than the thickness of a substrate 425, and each support plate 420 is preferably adapted to support a substrate 425 on upper surfaces 435 of substrate supports 440 in a generally horizontal plane.

Figure 5:
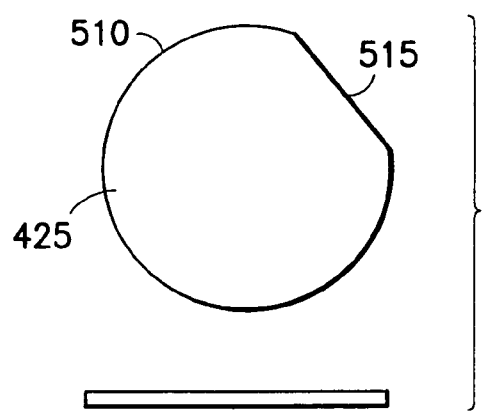
FIG. 5 is a diagram of an example substrate.

FIG. 5 shows an example of substrate 425. As mentioned above, substrate 425 may be a silicon planar substrate, a wafer, a flat panel display, or the like. Substrate 425 may have a peripheral edge 510 with any number of features including a fiducial 515.

Returning now to FIG. 2, substrate station 140 includes a shield 290 having an aperture 270 for loading and unloading substrates. Aperture 270 is preferably surrounded by a seal 275, against which magazine opening 310 may sealingly abut. When magazine opening 310 is in abutting relationship with seal 275, aperture 270 is aligned with magazine opening 310.

Figure 6A:
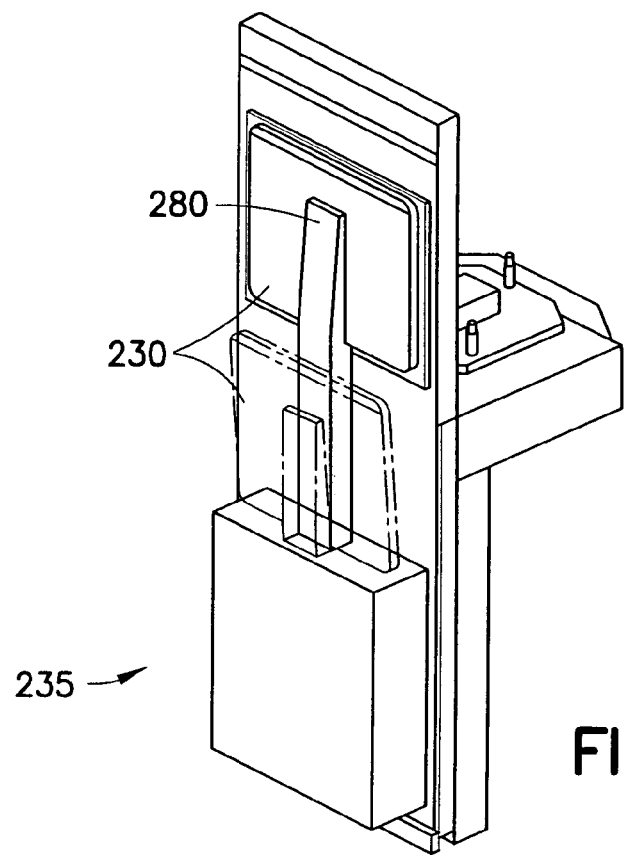
FIGS. 6A and 6B show an aperture closure in an extended and retracted position, respectively.

Substrate station 140 has a magazine door drive 235, shown in a retracted position, for sealing aperture 270 when magazine opening 310 is not abutting seal 275, and for coupling to and removing magazine door 315 when magazine opening 310 is abutting seal 275. Magazine door drive 235 includes an aperture closure 230 mounted on an extendable member 280 which is operated for both translation and pivoting movement by magazine door drive 235. When in an extended position, as shown in FIG. 6A, aperture closure 230 seals aperture 270. Returning to FIG. 2, aperture closure includes a door transport 285 for operating latch operating mechanism 340 (FIG. 3) so as to lock or release magazine door 315 from magazine 210 and to support magazine door 315 during translation and pivoting movements. Door transport 285 includes selectively operable door supports (not shown) which are engageable with magazine door 315 when magazine opening 310 is in abutting relationship with seal 275. Magazine 210, shield 290, aperture 270, and magazine door drive 235 are preferably located proximate a central area 264 of substrate station 140. In alternate embodiments, the area in which magazine 210, shield 290, aperture 270, and magazine door drive 235 are located may not be central Substrate station 140 also includes provisions for interfacing to an isolation valve 240 which couples substrate station 140 to transport chamber 120. Isolation valve 240 is positioned to allow substrates to be transported along a wafer transfer plane 265 between magazine 210 and transport chamber 120.

Substrate station 140 additionally includes an elevator 215 for moving magazine 210 in a Z-axis direction. Elevator 215 may comprise a shelf 237 for supporting magazine 210, attached to a drive 242, which may be a ball screw, belt drive, linear motor, or any other suitable device for supporting magazine 210 and providing vertical movement in accordance with the teachings of the invention.

Elevator 215 is operable to precisely move magazine 210. In the context of the present invention, "precisely move" means to repeatably position a substrate 425 held in magazine 210 within a usable range of motion. In one embodiment, elevator 215 is capable of repeatably positioning a substrate held in magazine 210 within at least 0.05 mm.

Elevator 215 is operable to precisely move magazine 210 to position each substrate 425 held in magazine 210 substantially in wafer transfer plane 265. In another embodiment, elevator 215 is operable to precisely move magazine 210 to position an upper surface 430 of any support plate 420 (FIG. 4), an upper surface 435 of any substrate support 440 (FIG. 4), or other location in the interior of magazine 210, substantially in wafer transfer plane 265. In still another embodiment, elevator 215 is preferably operable to move magazine 210 to place each substrate 425 held in magazine 210 at any desirable Z axis position. In yet another embodiment, elevator 215 is preferably operable to move magazine 210 in a way to place each substrate 425 held in magazine 210 at any desirable Z axis position accessible by transport apparatus 115. Because of the precision placement capabilities of elevator 215, a transport apparatus may be employed in substrate processing system 100 that has limited or no Z axis capability.

Substrate station 140 also includes a shuttle 220 for moving magazines along the Y-axis, and a buffer transport 225 for moving magazines in an X-axis direction. Substrate station 140 further includes a sensor 245 for mapping substrates and a mini-environment 250 for isolating the interior of magazine 210 from the surrounding atmosphere. Substrate station 140 may be mounted on a carriage 260 allowing substrate station 140 to move in the Y or X direction.

Figure 7:
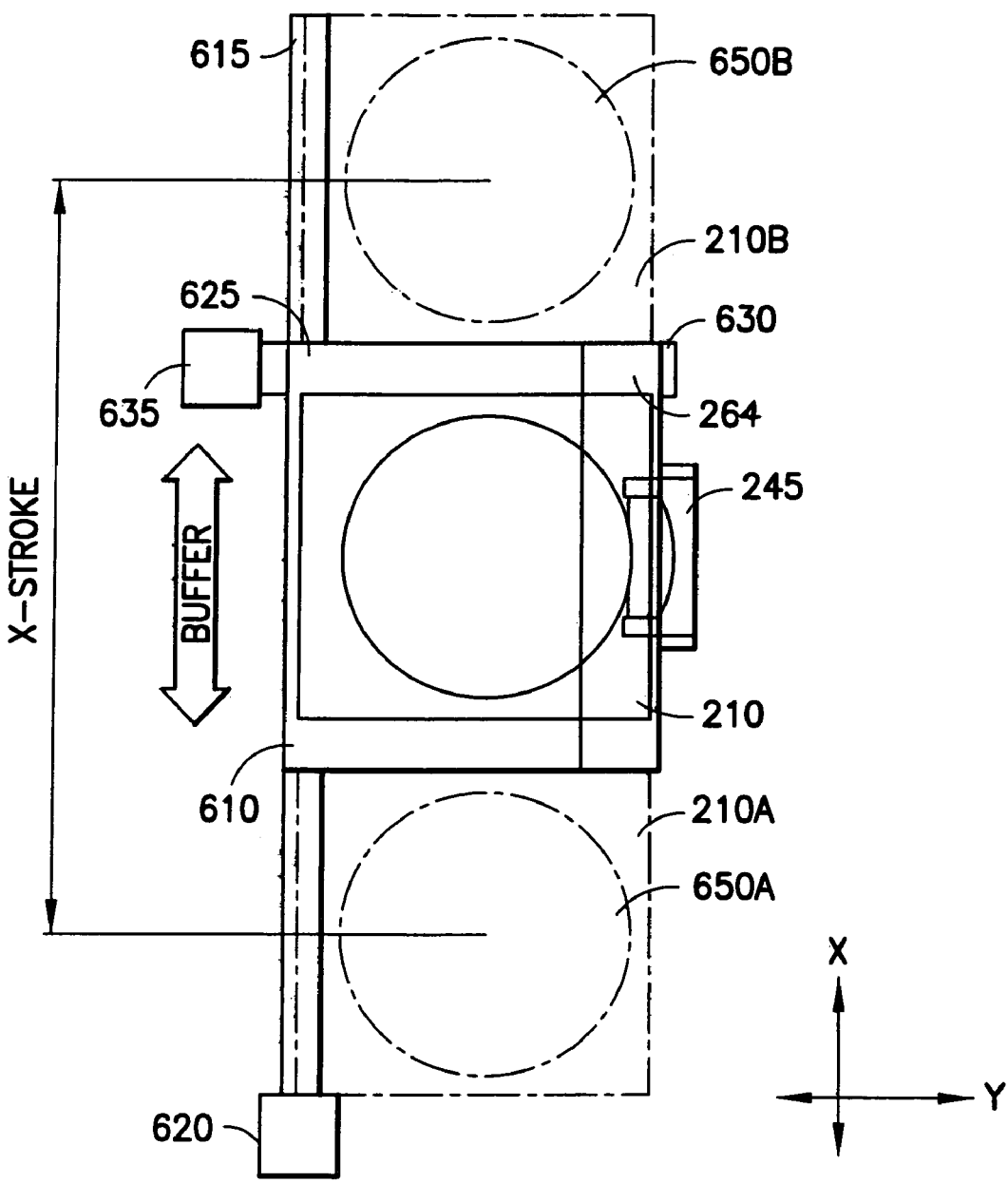
FIG. 7 shows a schematic top view of the substrate station.
Figure 8:
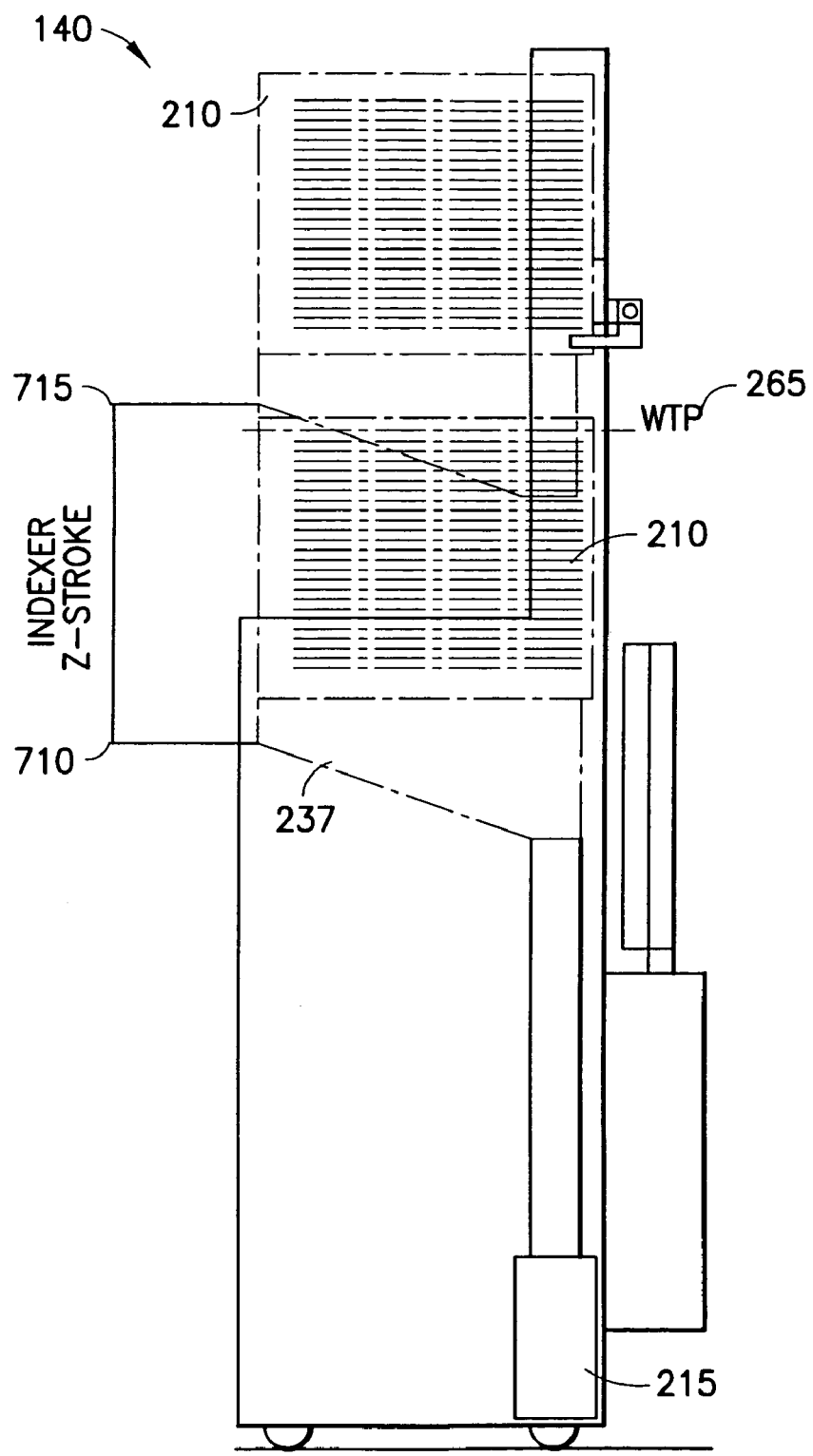
FIG. 8 shows a schematic side view of the substrate station illustrating a stroke of an elevator.

Turning now to FIG. 7, buffer transport 225 is adapted to move the one or more magazines 210 along the X-axis. Buffer transport 225 may be any suitable mechanism for transporting magazines 210 along the X axis, but is preferably a shelf 610, guided by a rail 615 aligned with the X axis, coupled to a drive mechanism. 620. Buffer transport 225 may include a screw, belt, carriage, or any type of driving or movement mechanism. In an embodiment where substrate station 140 includes a plurality of magazines 210, 210A, 210B, magazines 210A, 210B function as one or more substrate buffers, thus enabling the temporary storage or holding of substrates 425 either before or after processing. Buffer transport 225 is further operable to move individual magazines to and from peripheral areas 650A, 650B and into and out of central area 264.

Shuttle 220 may include any suitable mechanism for transporting magazines 210 along the Y axis. Shuttle 220 may also comprise a shelf 625 which, in one embodiment, may be shelf 610. Shelf 625 may guided by a rail 630 along the Y axis, and may be coupled to a suitable drive mechanism 635.

Returning now to FIG. 2, shuttle 220 operates to move the one or more magazines 210 in a forward Y direction, toward aperture 270, and in a rearward Y direction, away from aperture 270. Elevator 215 is operable to transport one or more magazines 210 vertically in an upward and downward Z direction. Shield 290 with aperture 270 is operable to move with elevator 215 and magazine 210 such that when magazine opening 310 is sealingly abutting seal 275, aperture 270 remains aligned with magazine opening 310 during movement of elevator 215. Buffer transport 225, shuttle 220, and elevator 215 may operate together to position one or more magazines at any location attainable within their combined range of motions.

Mini-environment 250 operates to isolate the interior of magazine 210 from the surrounding atmosphere while magazine 210 abuts seal 275 and magazine door 315 is unlatched and removed. Substrate station 140 optionally may include devices and mechanisms (not shown) capable of generating and maintaining an environment inside mini-environment 250 having certain characteristics, for example, atmospheric pressure, humidity, presence of certain compounds, etc. The devices and mechanisms may also be operable to match the environment of mini-environment 250 to another environment, for example, the environment of transport chamber 120. In a preferred embodiment, when isolation valve 240 is closed, mini-environment encloses an atmosphere at or slightly above standard atmospheric pressure, and when isolation valve is open, mini-environment encloses an atmosphere at the same pressure as transport chamber 120.

Sensor 245 for mapping substrates is preferably mounted to the frame of substrate transport station 140, inside mini-environment 250. Sensor 245 may comprise one or more distance measuring sensors, laser displacement meters, CCD sensors, imaging devices, opto-electronic sensors, capacitive sensors, or any sensor, sensors, or sensor system, suitable for mapping substrates. In a preferred embodiment, sensor 245 is a "through-beam" sensor.

Sensor 245 may be rotated to a retracted position A when not in use and rotated to position B for scanning or mapping operations after magazine opening 310 has been positioned in abutting relationship with seal 275 and magazine door 315 has been removed. Alternatively, sensor 245 may be retracted in a linear direction C and advanced to position B for scanning. In another embodiment, sensor 245 may be mounted in any orientation at any location so long as sensor 245 is capable of scanning substrates present inside magazine 210. Elevator 215 may then transport magazine 210 vertically such that substrates 425 within the magazine 210 pass in proximity to sensor 245, allowing sensor 245 to scan or map substrates 425. For example, as substrates 425 pass vertically by sensor 245, the sensor 245 may record their vertical positions. Optionally, sensor 245 may map the horizontal location, and the location of any number of points or features along each substrate's peripheral 510, including the location of the fiducial 515 (FIG. 5).

Example operations of substrate station 140 are described as follows with reference to FIGS. 2 and 6-9. In one example, operations may begin with aperture closure 230 in an extended position (FIG. 6A), effectively sealing aperture 270. Buffer transport 225 then operates to move a magazine 210 with a locked magazine door 315 along the X-axis from peripheral area 650A or 650B into central area 264. Shuttle 220 then operates to move magazine 210 in a forward Y direction until magazine opening 310 sealingly abuts seal 275.

Figure 6B:
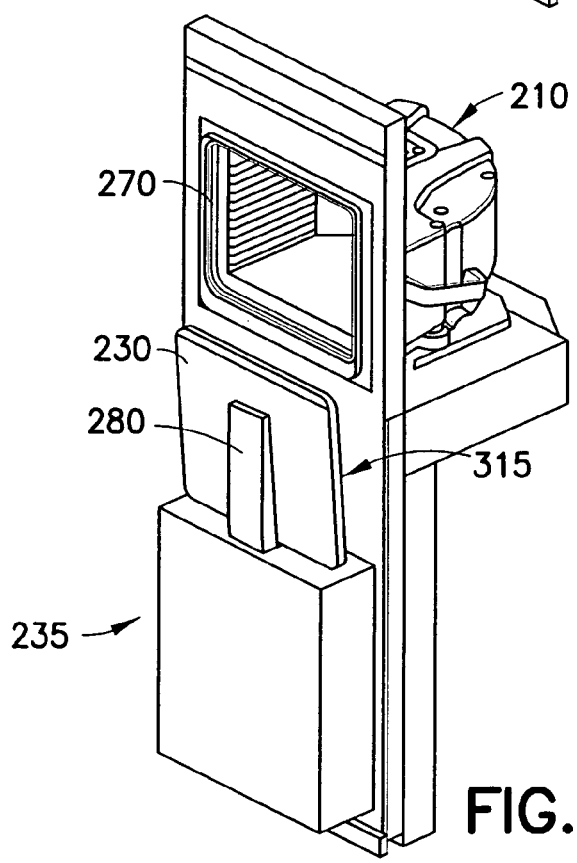

Magazine door drive 235 then operates aperture closure 230 so that door supports 295 on door transport 285 engage magazine door 315. Once door supports 295 have engaged magazine door 315, door transport 285 operates latch operating mechanism 340 to release magazine door 315 from magazine 210. Magazine door drive 235 then operates member 280 to remove magazine door 315 from magazine 215 and transport magazine door 315 to a lowered position, away from magazine opening 310 (FIG. 6B) . U.S. Pat. No. 6,071,059, incorporated by reference in its entirety, describes a typical door removal operation.

Sensor 245 then rotates to position B. Sensor 245 may be actuated directly or indirectly by the action of removing magazine door 315, or may be actuated independently. Isolation valve 240 may be opened simultaneously with the removal of magazine door 315, or may be opened at a later time.

Elevator 215 then vertically moves magazine 210 such that all substrates 425 are transported past sensor 245. In a preferred embodiment, shown in FIG. 8, elevator 215 is at least capable of moving shelf 237 from a lower position 710 to an upper position 715.

The vertical position of each substrate 245 is mapped as it passes sensor 245. After mapping is complete, sensor 245 may be returned to retracted position B.

Figure 9:
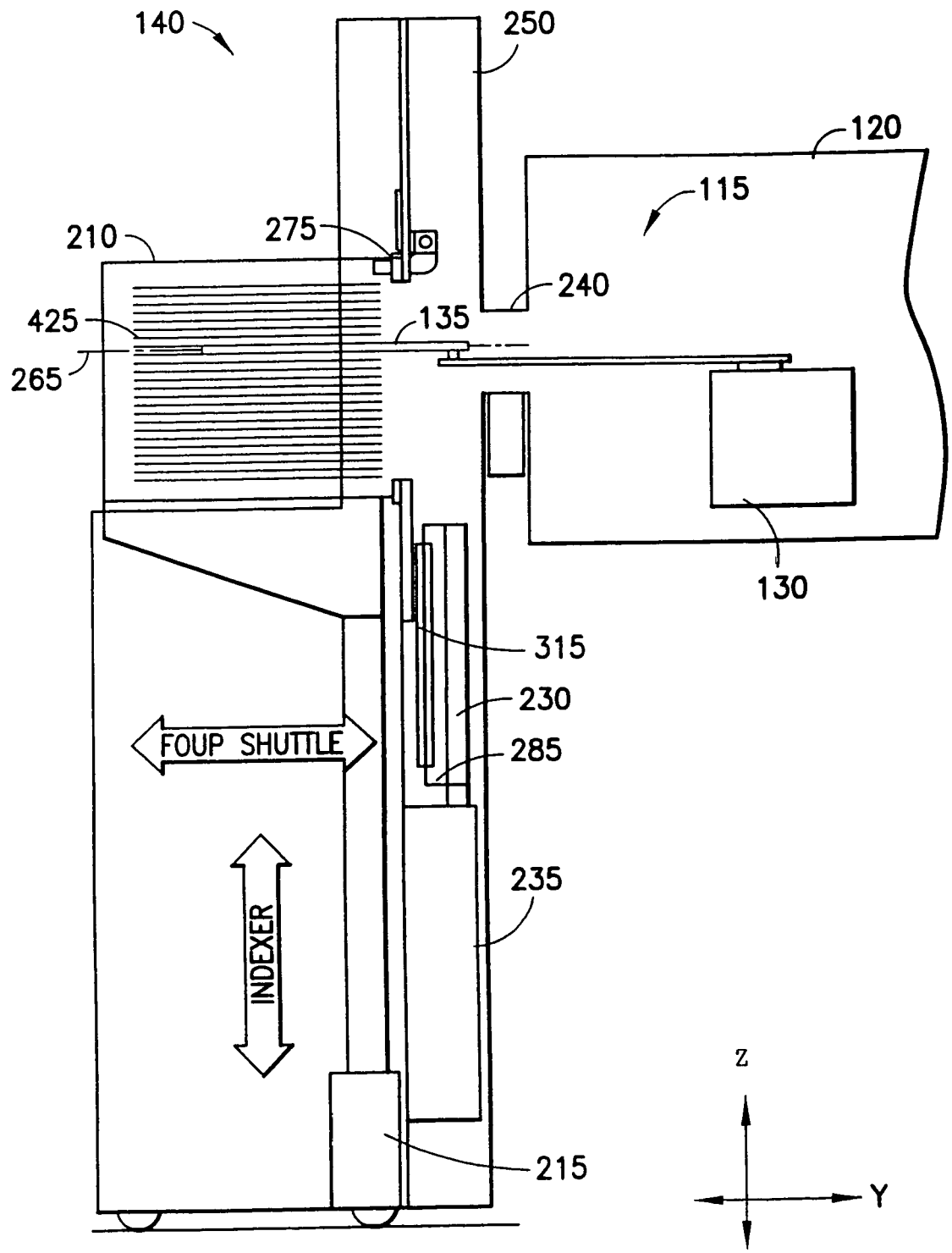
FIG. 9 shows a schematic side view of the substrate station illustrating an operation of a transport apparatus.

As shown in FIG. 9, elevator 215 then returns magazine 210 to a known height in central area 264, positioning a particular substrate 425 in wafer transfer plane 265, which is a plane that is accessible by transport apparatus 115. Isolation valve 240 may be opened at this time if not previously opened. Transport apparatus 115 may then extend end effector 135 into magazine 210 to remove substrate 425. Because the substrates have been mapped by sensor 245, the location of each substrate 425 is known and elevator 215 may subsequently move magazine 210 such that a particular substrate is positioned in wafer transfer plane 265 for removal by transport apparatus 115 without any significant Z-axis movement by transport apparatus 115. Transport apparatus 115 may then replace substrates 425 in magazine 210 in a similar fashion, where elevator 215 moves magazine 210 such a that a particular support plate 420 (FIG. 4) of magazine 210 is situated adjacent wafer transfer plane 265, allowing transport apparatus 115 to replace a previously removed substrate or to place another substrate in magazine 210. Substrate station 140 may coordinate the movements of elevator 215 with the movements of transport apparatus 115 such that substrates 425 may be removed from or placed into magazine 210 in any desirable order or location.

When access to magazine 210 is no longer required, Transport apparatus 115 retracts end effector 135 and isolation valve 240 may be closed while magazine door drive 235 replaces and locks magazine door 315. In one embodiment, the action of replacing magazine door 315 may cause sensor 245 to move to retracted position B. When isolation valve 240 is closed and magazine door has been replaced and locked, shuttle 220 may then operate to move magazine 210 in a rearward Y direction, causing magazine opening 310 to disengage from seal 275.

Buffer transport 225 may then move magazine 210 to one of the peripheral areas for example, 650B (FIG. 6), and then move magazine 210A from peripheral area 650A to central area 264 for processing the substrates therein. As mentioned above, buffer transport is capable of moving any one of the magazines among peripheral areas 650A, 650B, and central area 264 as required for loading, unloading, and processing of substrates.

Figure 10:
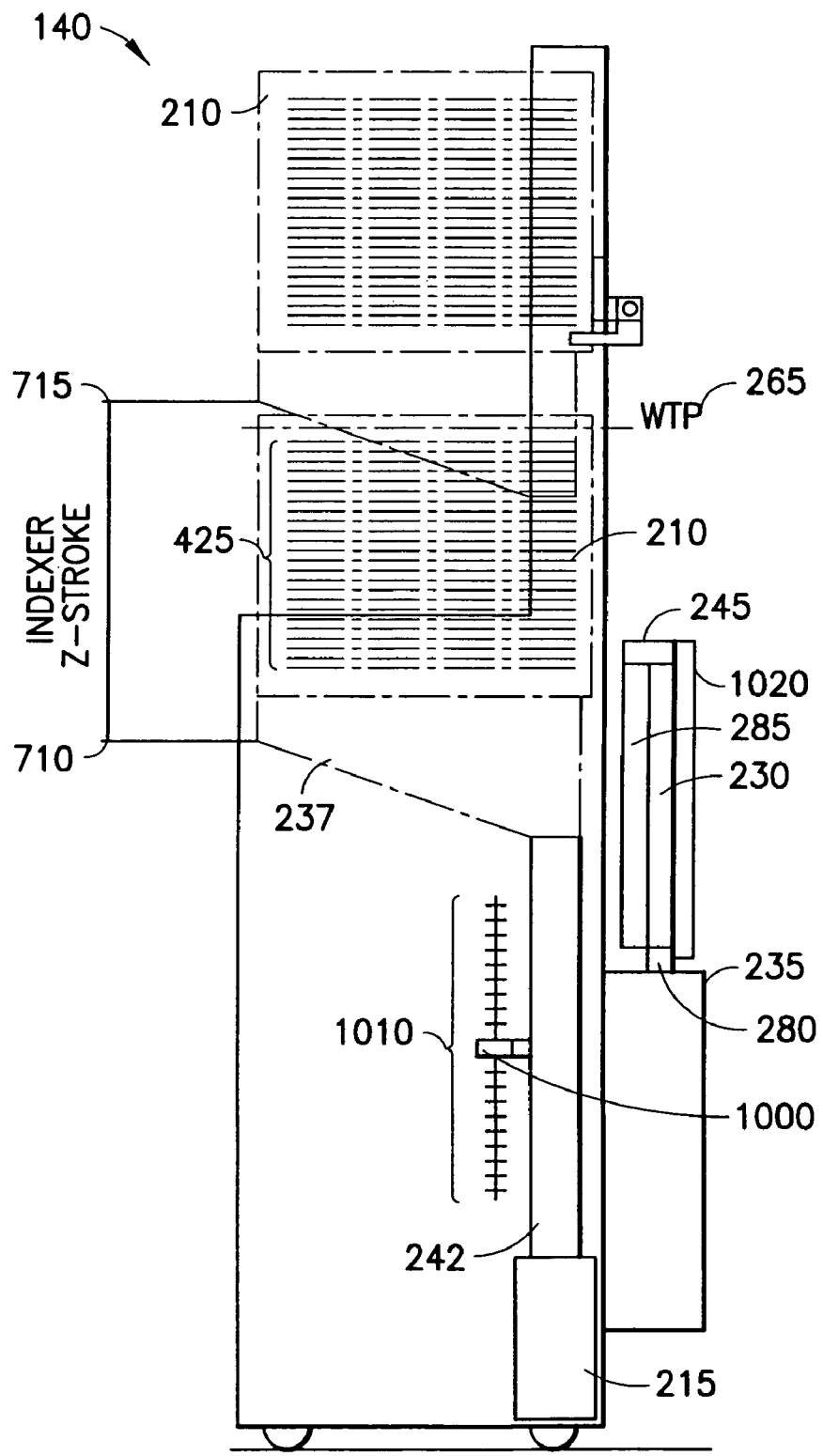
FIG. 10 shows a schematic side view of the substrate station illustrating an alternate placement of a sensor.

FIG. 10 shows another embodiment of the invention where sensor 245 is part of magazine door drive 235. In this embodiment, magazine door drive 235 additionally operates to place sensor 245 in position for mapping substrates 425 inside magazine 210. Sensor 245 may be mounted to member 280, for example, by way of a bracket 1020 and may extend above, to the side, or below aperture closure 230. Alternately, sensor 245 may be mounted on aperture closure 230 or member 280. In other embodiments, sensor 245 may be mounted directly or indirectly to magazine door drive 235 utilizing any arrangement, so long as magazine door drive 235 is capable of placing sensor 245 in a mapping position.

Exemplary mapping operations utilizing this embodiment may begin with aperture closure 230 in an extended position (FIG. 6A), to seal or cover aperture 270. Shuttle 220 (FIG. 2) then operates to move magazine 210 in a forward direction until magazine opening 310 sealingly abuts seal 275. Magazine door drive 235 then operates to engage magazine door 315, operate latch operating mechanism 340 to release and remove magazine door 315 from magazine 210 as described above, transport magazine door 315 through aperture 270 to a lowered position, away from magazine opening 310 (FIG. 6B). Magazine door drive 235 may then operate to position sensor 245 in view of substrates 425. Alternately, sensor 245 may be positioned and magazine door drive may operate such that magazine door drive 235 may position sensor 245 for mapping without moving magazine door 315 to a lowered position, or without moving magazine door 315 away from magazine opening 310.

As described above, elevator 215 vertically moves magazine 210 such that all substrates 425 are transported past sensor 245. The vertical position of each substrate 245 is mapped as it passes sensor 245. In one embodiment, elevator 215 may move vertically and mapping may occur simultaneously with the release and removal of magazine door 315 from magazine 210. After mapping is complete, elevator 215 may return to a rest position and magazine door drive 235 may re-engage magazine door 315 with magazine 210.

In some embodiments, magazine door drive 235 may be a fluidic drive, for example, a pneumatic drive. To provide for more accurate positioning, elevator 215 or elevator drive 242 may be equipped with an encoder 1000 which provides elevator position information. Encoder 1000 may be any type of encoder capable of providing information regarding the vertical position of the elevator. In one embodiment, encoder 1000 may be an optical encoder that may operate to read a scale 1010 to determine position information. Optical encoder 1000 and sensor 245 may be operated together to map substrates 425. For example, after sensor 245 has been placed in mapping position by magazine door drive 235, an output of sensor 245 may be monitored while elevator 215 moves magazine 210 from lower position 710 to upper position 715. As sensor 245 detects an individual substrate, the position of elevator 215 as reported by encoder 1000 may be recorded. These positions may then be translated to substrate positions, for example, by using known dimensions of system 100.

Figure 11:
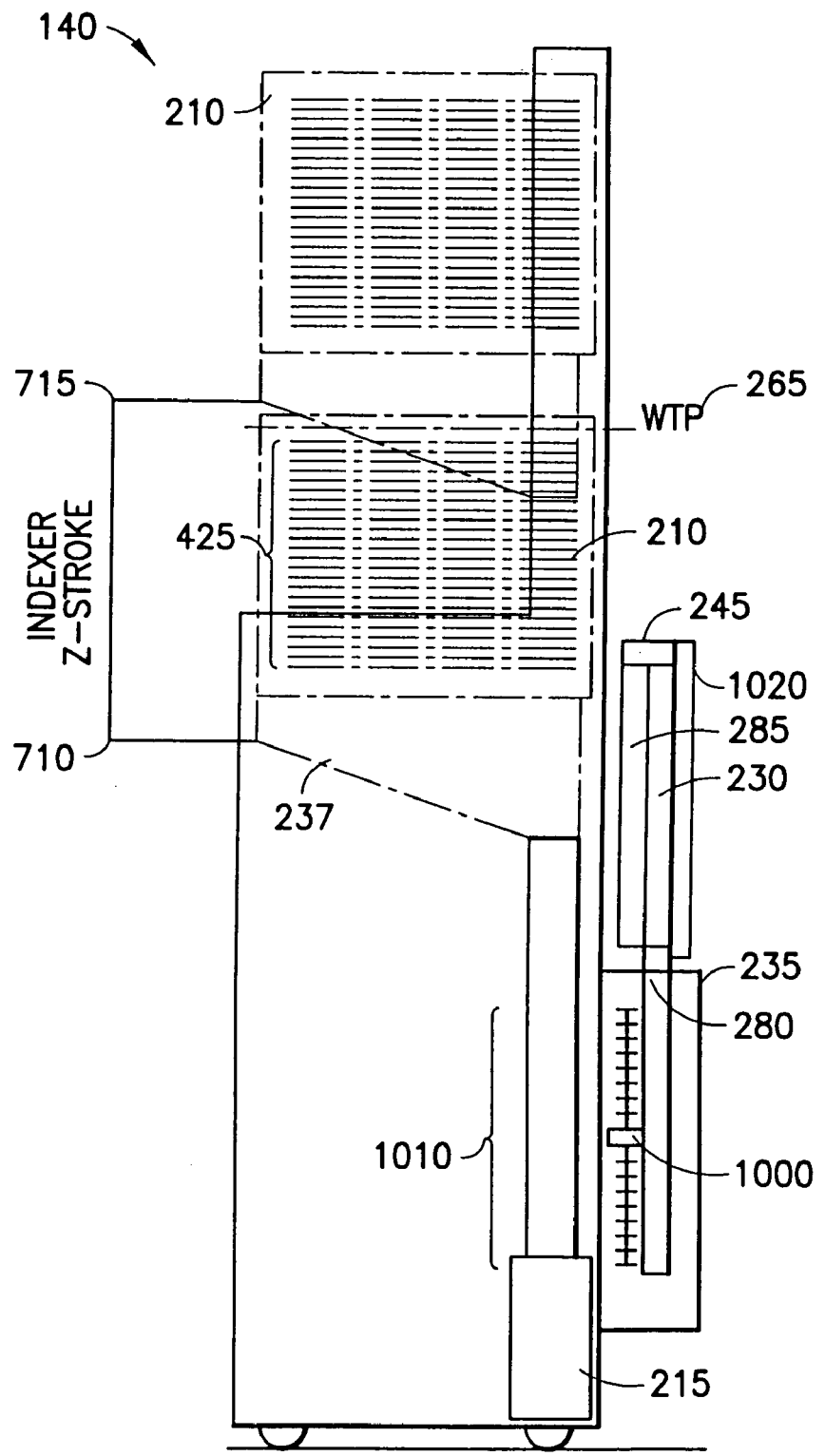
FIG. 11 shows another schematic side view of the substrate station illustrating an alternate placement of a sensor and an encoder.

FIG. 11 shows yet another embodiment of the invention where sensor 245 is part of magazine door drive 235 and encoder 1000 may also be a part of magazine door drive 235. Encoder 1000 may be any type of encoder capable of providing information regarding the position of the magazine door drive 235, and may be located anywhere within system 100. As mentioned above, encoder 1000 may be an optical encoder that may operate to read a scale 1010 to determine position information. An exemplary mapping operation may be performed by operating magazine door drive 235 while monitoring an output of encoder 1000 and an output of sensor 245. As sensor 245 detects an individual substrate, the position of magazine door drive 235 as reported by encoder 1000 may be processed with the output of sensor 245 to determine substrate positions.

Thus, substrate station 140 is capable of holding a buffer of substrates 425 for processing, disposition after processing, or storage. Sensor 245 is capable of mapping the location and features of substrates 425 while situated near magazine 210, preferably positioned in central area 264. Buffer transport 225, shuttle 220, and elevator 215 are capable of operating together to position one or more magazines 210, and thus the substrates therein, at any position within their combined range of motions. One advantage of these mapping and positioning capabilities is the ability to place each substrate at the wafer transfer plane 265, eliminating the need for any significant Z-axis movement by transport apparatus 115. Substrate station 140 is capable of being mated directly to transport chamber 120, thus eliminating the need for a front end for substrate alignment and placement.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

What is claimed is:

1. A substrate processing apparatus having a station for loading and unloading substrates from the apparatus, the station comprising:
   an aperture closure for sealing a loading and unloading aperture of the station, the aperture being configured for loading and unloading substrates from a substrate magazine;
   apparatus for removing a door of the substrate magazine and thus opening the substrate magazine, and for operating the aperture closure to open the aperture;
   an elevator for precisely positioning the open substrate magazine along a vertical axis within a usable range of motion;
   a buffer transport for positioning the substrate magazine along a second axis oriented in a second direction different from the vertical axis; and
   a shuttle for transporting the substrate magazine along a third axis oriented in a third direction different from the vertical and second directions;
   wherein the buffer transport is operative for moving the substrate magazine between a first position and a second position, wherein when in the first position the substrate magazine is seated onto a magazine support of the buffer transport and communicates with the aperture, and when moved to the second position the substrate magazine is offset from the first position and is buffered adjacent the aperture while remaining seated on the magazine support so that another substrate magazine is capable of being located at the first position in communication with the aperture, wherein the buffer transport is arranged so that each substrate magazine is individually movable between the first and second positions while the substrate magazine remains seated on the magazine support and wherein the first and second positions are horizontally coplanar.

2. The substrate processing apparatus of claim 1, wherein the elevator operates such that a substrate within the open magazine is positioned substantially in a wafer transport plane, the substrate processing apparatus further comprising a transport apparatus for accessing the substrate in the wafer transport plane through the aperture.

3. The substrate processing apparatus of claim 2, wherein the elevator includes a device for positioning the open substrate magazine such that substantially no vertical movement is required by the transport apparatus.

4. The substrate processing apparatus of claim 1, wherein the first and second positions are substantially in a plane that includes the second axis.

5. The substrate processing apparatus of claim 1, wherein the second position is in a peripheral area and the first position is in a central area.

6. The substrate processing apparatus of claim 5, wherein the buffer transport is operable to place the magazine in the peripheral area and the central area.

7. The substrate processing apparatus of claim 6, wherein the elevator is operable to move the magazine placed in the central area.

8. The substrate processing apparatus of claim 1, wherein the station further comprises a sensor for mapping vertical locations of the substrates.

9. The substrate processing apparatus of claim 1, wherein the station further comprises a mini-environment for interfacing the station to the substrate processing apparatus.

10. The substrate processing apparatus of claim 1, wherein the buffer transport includes more than one horizontally adjacent magazine support for supporting substrate magazines, where each of the substrate magazines remain on a respective one of the magazine supports during horizontal movement of the buffer transport for positioning the substrate magazines between the first and second positions.

11. A substrate processing apparatus having a station for loading and unloading substrates from the apparatus, the station comprising:
   an aperture closure for sealing a loading and unloading aperture of the station, the aperture being configured for loading and unloading substrates from a substrate magazine;
   apparatus for removing a door of the substrate magazine and thus opening the substrate magazine, and for operating the aperture closure to open the aperture;
   an elevator for precisely positioning the open substrate magazine along a vertical axis within a usable range of motion;
   a buffer transport for positioning the substrate magazine along a second axis oriented in a second direction different from the vertical axis;
   a shuttle for transporting the substrate magazine along a third axis oriented in a third direction different from the vertical and second directions;
   wherein the buffer transport is operative for moving the substrate magazine between a first position and a second position, wherein when in the first position the substrate magazine is located onto a magazine support of the buffer transport and communicates with the aperture, and when moved to the second position the substrate magazine is offset from the first position and is buffered adjacent the aperture while remaining on the magazine support, and wherein the first and second positions are horizontally coplanar; and
   a sensor rotatably mounted on a frame of the station such that upon removal of a door of the magazine, the sensor rotates so that an emitter and receiver of the sensor extends inside the magazine.

12. The substrate processing apparatus of claim 11, wherein the sensor is capable of mapping the vertical location while the elevator is precisely positioning the open substrate magazine along the vertical axis.

* * * * *